(12) United States Patent
Schaffer et al.

(10) Patent No.: US 6,650,953 B2
(45) Date of Patent: Nov. 18, 2003

(54) MODULAR OPTIMIZER WITH PRECEDENCE CONSTRAINT-HANDLING FEATURE FOR OPTIMIZATION OF COMPONENT PLACEMENT MACHINES

(75) Inventors: J. David Schaffer, Wappingers Falls, NY (US); Larry J. Eshelman, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 250 days.

(21) Appl. No.: 09/759,096

(22) Filed: Jan. 12, 2001

(65) Prior Publication Data

US 2002/0138673 A1 Sep. 26, 2002

(51) Int. Cl.[7] .............................................. G06F 19/00
(52) U.S. Cl. ...................................... 700/103; 700/100
(58) Field of Search ................................. 700/103, 100

(56) References Cited

U.S. PATENT DOCUMENTS

| | | | |
|---|---|---|---|
| 5,177,688 A | * | 1/1993 | Rentschler et al. .......... 700/101 |
| 5,280,425 A | * | 1/1994 | Hogge ......................... 712/300 |
| 5,390,283 A | * | 2/1995 | Eshelman et al. ............ 706/13 |
| 5,739,525 A | * | 4/1998 | Greve .................... 250/227.11 |
| 5,864,833 A | * | 1/1999 | Schaffer et al. ............... 706/13 |
| 5,909,674 A | * | 6/1999 | Schaffer et al. ............... 706/13 |

\* cited by examiner

*Primary Examiner*—Leo Picard
*Assistant Examiner*—Michael D. Masinick
(74) *Attorney, Agent, or Firm*—Steven R. Biren

(57) ABSTRACT

A modular optimizer, for use in determining a configuration of a production line with one or more component placement machines, is configured to handle precedence constraints. The precedence constraints may be of the form A B MT, which specifies that part A must be placed on a designated assembly board before part B if either part is to be placed by a machine type MT. A given set of precedence constraints includes at least a first class of constraints that apply to only one component placement machine type and a second class of constraints that apply to more than one component placement machine type. Assignment of constraints to the different classes is based on decisions of a part splitter module of the modular optimizer regarding which parts are assigned to which machine types. Each of the constraints in the first class of constraints associated with a given machine type are handled in a corresponding machine module of the modular optimizer. The second class of constraints is handled in the part splitter module of the modular optimizer. Outputs of the part splitter module are delivered to the machine modules and processed therein to generate information used in determining the configuration.

34 Claims, 5 Drawing Sheets

MODULAR OPTIMIZER WITH PRECEDENCE CONSTRAINT-HANDLING FEATURE FOR OPTIMIZATION OF COMPONENT PLACEMENT MACHINES

RELATED APPLICATION

The present invention is related to the invention described in U.S. patent application Ser. No. 09/286,026 filed Apr. 5, 1999 in the name of inventors Larry J. Eshelman and J. David Schaffer and entitled "Method for Optimizing a Line of Pick and Place Machines," which is commonly assigned herewith and incorporated by reference herein.

FIELD OF THE INVENTION

The present invention relates generally to component placement machines, such as so-called "pick and place" machines used in assembly of surface mount devices (SMDs) and other components onto printed circuit boards (PCBs), and more particularly to optimizers for use in configuring such machines.

BACKGROUND OF THE INVENTION

Known techniques for optimization of pick and place machines and other types of component placement machines are described in U.S. Pat. No. 5,390,283 issued Feb. 14, 1995 in the name of inventors Larry J. Eshelman and J. David Schaffer and entitled "Method for Optimizing the Configuration of a Pick and Place Machine," U.S. Pat. No. 5,864,833 issued Jan. 26, 1999 in the name of inventors J. David Schaffer and Murali Mani and entitled "Apparatus for Optimizing the Layout and Charge Maps of a Flowline of Pick and Place Machines," and U.S. Pat. No. 5,909,674 issued Jun. 1, 1999 in the name of inventors J. David Schaffer and Murali Mani and entitled "Method for Optimizing the Layout and Charge Maps of a Flowline of Pick and Place Machines," all of which are commonly assigned with the present application and incorporated by reference herein.

Despite the considerable advances provided by the techniques described in the above-cited references, further improvements are needed in optimization of component placement machines. For example, existing component placement machine optimizers are not readily configurable to handle arbitrary numbers of precedence constraints, i.e., constraints which specify that one part must be placed by the machine before another part. Such constraints are becoming increasingly important as a result of the stringent tolerance requirements associated with shrinking component and board sizes. It is therefore apparent that a need exists for a modular optimizer which provides efficient handling of an arbitrary number of precedence constraints.

SUMMARY OF THE INVENTION

The invention provides improved techniques for optimization of component placement machines. In accordance with one aspect of the invention, a modular optimizer for a component placement machine is configured so as to be able to handle multiple precedence constraints in an efficient manner.

More particularly, a modular optimizer configured in accordance with the invention is used to determine a configuration of a production line including one or more component placement machines. The precedence constraints may be of the form A B MT, which specifies that part A must be placed on a designated printed circuit board (PCB) or other type of assembly structure before part B if either part is to be placed by a machine type MT. A given set of precedence constraints includes at least a first class of constraints that apply to only one component placement machine type and a second class of constraints that apply to more than one component placement machine type. Assignment of constraints to the different classes is based on decisions of a part splitter module of the modular optimizer regarding which parts are assigned to which machine types. Separation of the set of precedence constraints into the first and second classes of precedence constraints is thus implemented at least in part in the part splitter module of the modular optimizer.

Each of the constraints in the first class of constraints associated with a given machine type is handled in a corresponding machine module of the modular optimizer. For example, constraints associated with only a Fast Component Mounter (FCM) machine are handled in an FCM module of the modular optimizer, while constraints associated with only an Advanced Component Mounter (ACM) machine are handled in an ACM module of the modular optimizer. The second class of constraints is handled in the part splitter module of the modular optimizer. As a result, if two parts associated with a given precedence constraint are assigned to two different machine types, the splitter module determines if the assignment is feasible. Outputs of the part splitter module are delivered to the machine modules and processed therein to generate information used in determining the configuration of the production line.

In accordance with another aspect of the invention, for a given precedence constraint of the form A B MT, the part splitter module may: (i) assign neither part A nor part B to a machine of type MT, in which case the constraint can be ignored; (ii) assign both part A and part B to machines of type MT, such that the constraint is in the first class of constraints and is handled by the machine module corresponding to machine type MT; or (iii) assign one of part A and part B to one machine type and the other part to another machine type, such that the constraint is in the second class of constraints and is handled by the part splitter module.

In accordance with a further aspect of the invention, the processing of the precedence constraints may utilize a data structure which includes static constraint counts and dynamic constraint counts. The static constraint counts are generally determined upon reading of a precedence constraint file. The dynamic constraint counts are generally determined on a cumulative basis in accordance with decisions of the splitter module regarding assignment of particular parts to particular machine types.

DETAILED DESCRIPTION OF THE INVENTION

The present invention provides techniques for configuring component placement machine optimizers to handle precedence constraints. The invention will be illustrated in conjunction with example production line, component placement machine and modular optimizer elements. It should be understood, however, that these elements are shown by way of example only, and are not intended to limit the scope of the invention. Those skilled in the art will recognize the precedence constraint-handling features provided by the present invention can be implemented using numerous other arrangements of these and other elements.

I. Example Production Line and Component Placement Machine

Figure 1:
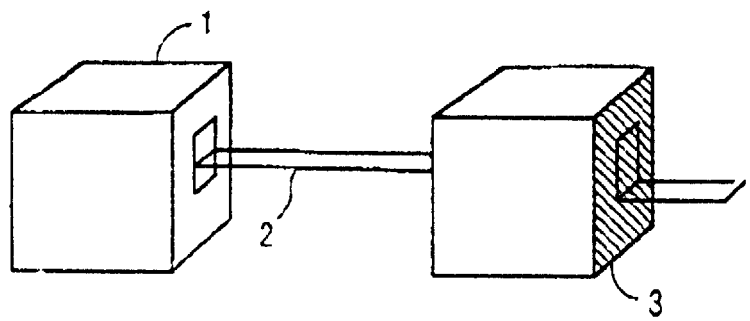
FIG. 1 is a simplified diagram showing an example production line with two component placement machines that may be configured using a modular optimizer with a precedence constraint-handling feature in accordance with the invention.

FIG. 1 shows a simplified diagram of a production line that may be configured using a modular optimizer in accordance with the present invention. The production line includes a first component placement machine 1, a conveyor 2, and a second component placement machine 3. Printed circuit boards (PCBs) or other component mounting support structures pass through the machines 1, 3 of the line on the conveyor 2. One or both of the component placement machines 1, 3 may be, e.g., a Fast Component Mounter (FCM) machine or an Advanced Component Mounter (ACM) machine, which are types of component placement machines known in the art and described in greater detail in the above-cited U.S. Pat. Nos. 5,390,283, 5,864,833 and 5,909,674 and the above-cited U.S. patent application Ser. No. 09/286,026.

Although the figure shows two machines on a single line, the invention is applicable to production lines having more than two machines, as well as to production lines having only a single machine. In addition, the machines of a given production line may include one or more machines for each of a number of different machine types.

Figure 2:
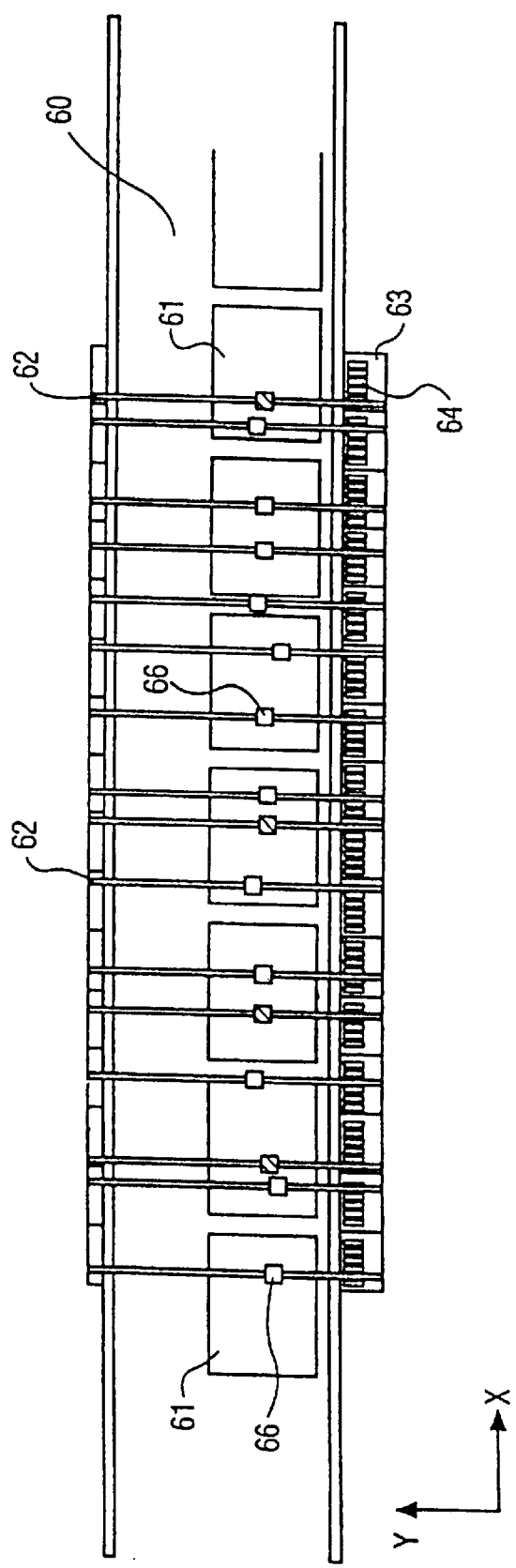
FIG. 2 shows a top view of one example of a Fast Component Mounter (FCM) component placement machine that may be utilized in conjunction with the invention.
Figure 3:
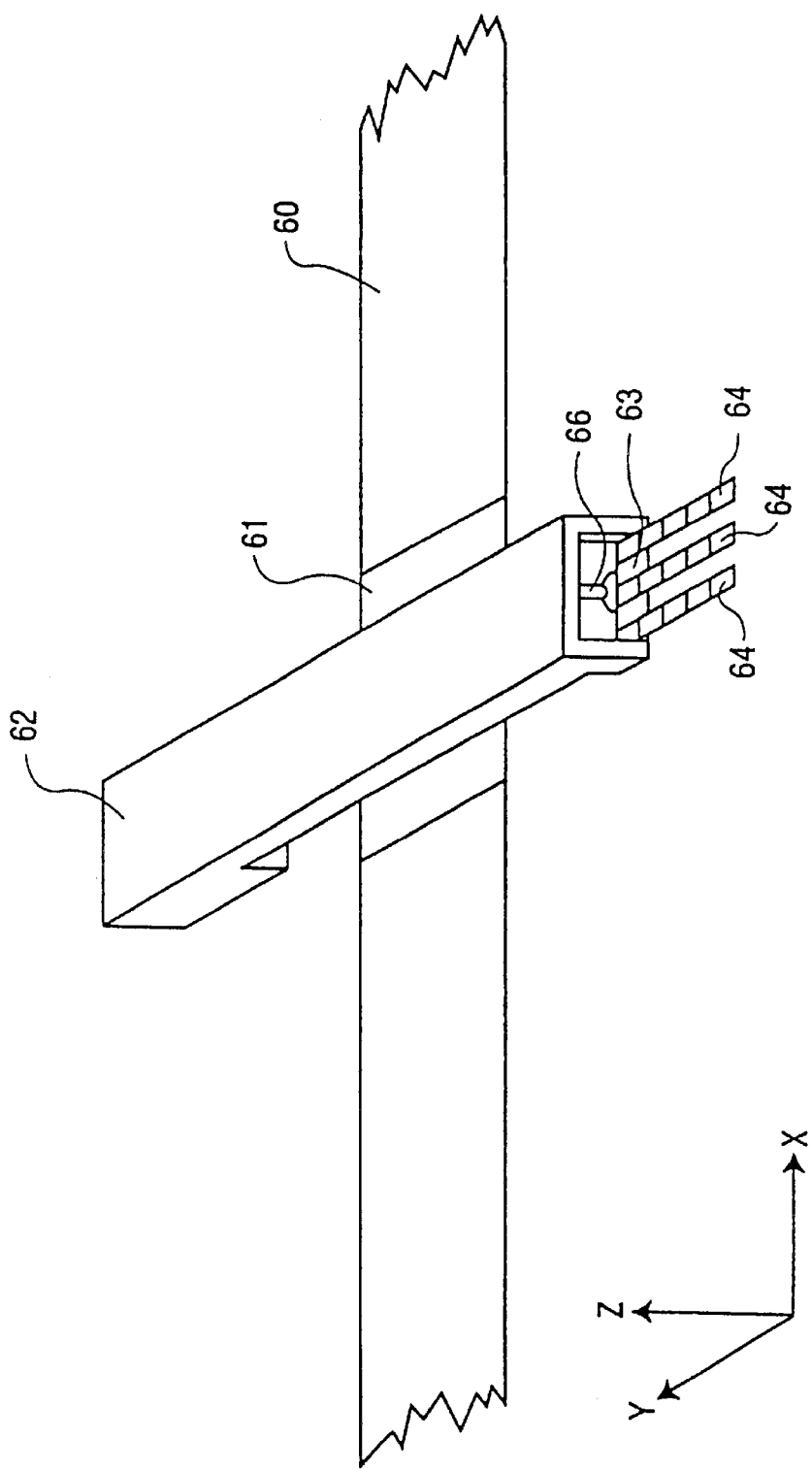
FIG. 3 is a perspective view of one pipette module (PM) of the FCM machine of FIG. 2.

FIGS. 2 and 3 illustrate in greater detail an FCM machine that may be used for one or both of the machines in the production line of FIG. 1. More particularly, FIG. 2 shows a top view of an example FCM machine with 16 pick-and-place or pipette modules (PMs), and FIG. 3 shows a perspective view of one of the PMs. The FCM machine as shown includes a transport system 60 that carries a train of PCBs 61 under a series of, in this example, 16 independent PMs 62. The transport system 60 advances in steps (referred to as index steps) between which the PCBs rest stationary for a period of time while the PMs place part types. Each PM 62 has a corresponding feeder bar 63 (in front of the machine as shown in FIG. 2) to which can be attached a variety of component feeder types 64 (e.g., tapes, sticks, bulk feeders, etc.). Further, each PM 62 has a width, a portion of which is in its reachable zone. In this example, each PM 62 is 120 mm wide with 80 mm of this being its reachable zone, although these dimensions may be easily altered. No interference between the PMs is permitted.

Feeders are placed within the reachable zone on the feeder bar 63. For this purpose, feeders are attached at specified intervals through feeder slots. In FIG. 2 for this example, six feeder slots are shown. The transport system 60 travels left to right. New PCBs enter the FCM on a conveyor belt or movable machinery at the left end and completed PCBs exit from the right end. Each PM 62 has a single movable placement head 66 with independent control in the x (left to right), y (front to back), z (up/down), and phi (rotation about z) directions. Each control can have different accelerations and maximum velocities; therefore, the travel time from a pick position to a place position is the maximum of the x, y, and phi times. Movement in the z direction may be accounted for in fixed delays for pick and for place.

Each PM 62 may be fitted with a particular nozzle for picking up parts, a phi placement unit for accurate mechanical alignment, and/or a vision system to compute alignment offset. A nozzle and phi placement unit combination, called a gripper, allows the placement of parts within certain size, shape and/or weight limits. Each part may have a particular gripper type designated for use therewith, or system software may be configured to select a suitable gripper from among a number of alternative grippers.

For the FCM, an optimization task may be, given a parts list specifying the x, y, and phi location of each part to be placed and its respective gripper or list of alternative grippers and feeder type, and given a specification of a line of FCM machines (how many machines, how many PMs on each), produce a layout and set of charge maps that will, in this example, minimize the time required to populate the PCBs with all their parts. This is referred to as minimization of cycle time. Other merit measures may be substituted or added to the cycle time merit measure. For example, minimizing set-up and/or changeover time or achieving a minimum cycle time while also minimizing a number of feeders. The optimization should allow an FCM user to prespecify upper limits on a number of grippers of a particular type to be used, and/or a number of feeders feeding a particular part type. Additionally, the FCM user should be free to prespecify that particular grippers be assigned to specific PMs and that particular feeder slots must feed particular part types. Some PMs and some feeder slots may also be prespecified to not be used.

Additional details regarding the example FCM of FIGS. 2 and 3 may be found in the above-cited U.S. Pat. Nos. 5,390,283, 5,864,833 and 5,909,674.

II. Example Modular Optimizer

An example modular optimizer in accordance with the illustrative embodiment of the present invention will now be described in conjunction with FIGS. 4 and 5. This example optimizer is similar to the modular optimizer described in greater detail in the above-cited U.S. patent application Ser. No. 09/286,026, but is modified to include a precedence constraint-handling feature in accordance with the present invention. It should be understood, however, that the techniques of the invention are more generally applicable to any type of modular optimizer for component placement machines in which it is desirable to implement a capability for handling precedence constraints.

Figure 4:
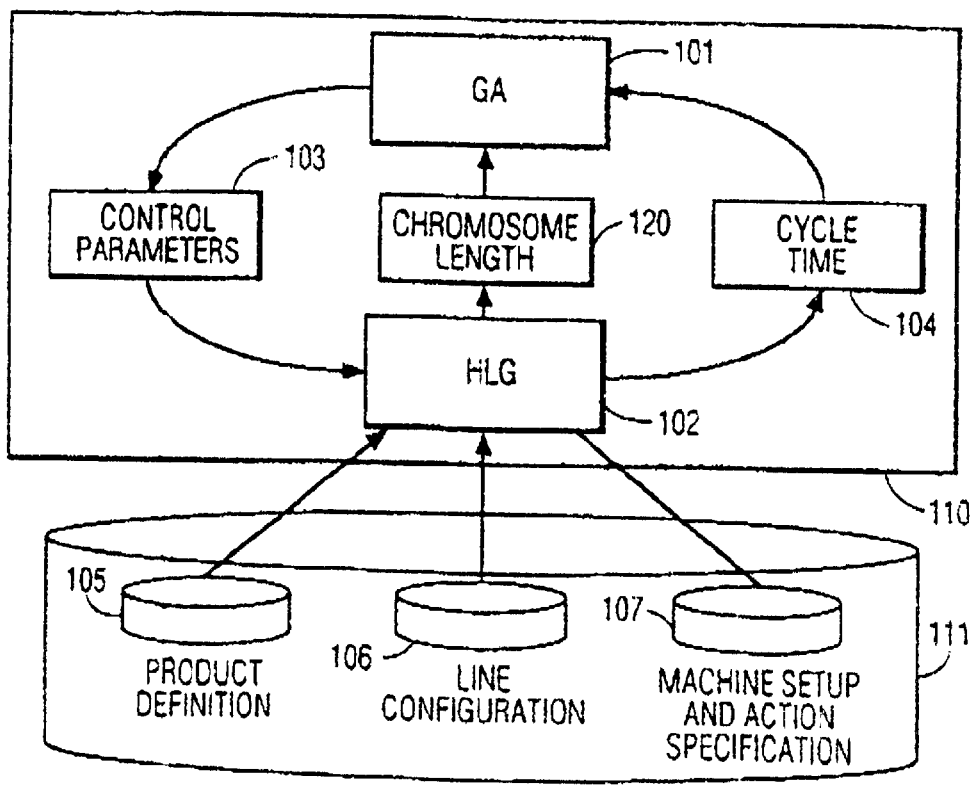
FIG. 4 is a schematic diagram of an example modular optimizer having a precedence constraint-handling feature in accordance with the invention.

FIG. 4 shows a schematic diagram of the example modular optimizer in which the invention may be implemented. It should be understood that the optimizer as shown in FIG. 4 is actually a general optimizer, that may or may not be modular. However, the general optimizer is modular when it includes elements configured as shown in FIG. 5. The optimizer of FIG. 4 will therefore be referred to herein as a modular optimizer. Of course, this is only an example, and the invention can be implemented using other types of modular optimizers.

As noted previously, the modular optimizer of FIG. 4 may be used to optimize the component placement machines 1, 3 of FIG. 1, and may be configured in accordance with the invention to include a precedence constraint-handling feature. The modular optimizer includes a processor 110 which implements a genetic algorithm (GA) 101 and a heuristic layout generator (HLG) 102. Within the processor 110, the GA 101 interacts iteratively with the HLG 102. The processor 110 can be either internal or external to the machines 1, 3.

The GA 101 maintains a population of chromosome strings, which are not shown in the figure. A length 120 of the chromosome strings is supplied to the GA 101 by the HLG 102, during an initialization step. In response to that length, the GA 101 creates the first population of strings. In later iterations, the GA 101 applies mutation and/or crossover, in accordance with the particular type of GA 101. As in the above-cited U.S. patents, CHC is the preferred type, though other types might equally well be used. The GA 101 then supplies chromosome strings as control parameters 103 to the HLG 102.

The HLG 102 interacts with files defining the product to be manufactured 105, line configuration 106, and machine setup and specification 107, all of which are stored within a memory device 111. The HLG 102 then supplies to the GA 101 measures of fitness 104 associated with the chromosome strings 103. These measures may be cost functions such as the above-noted cycle times. The GA 101 uses these measures of fitness in later iterations.

The cycle illustrated in FIG. 4 repeats until a specified criterion of termination is reached.

Figure 5:
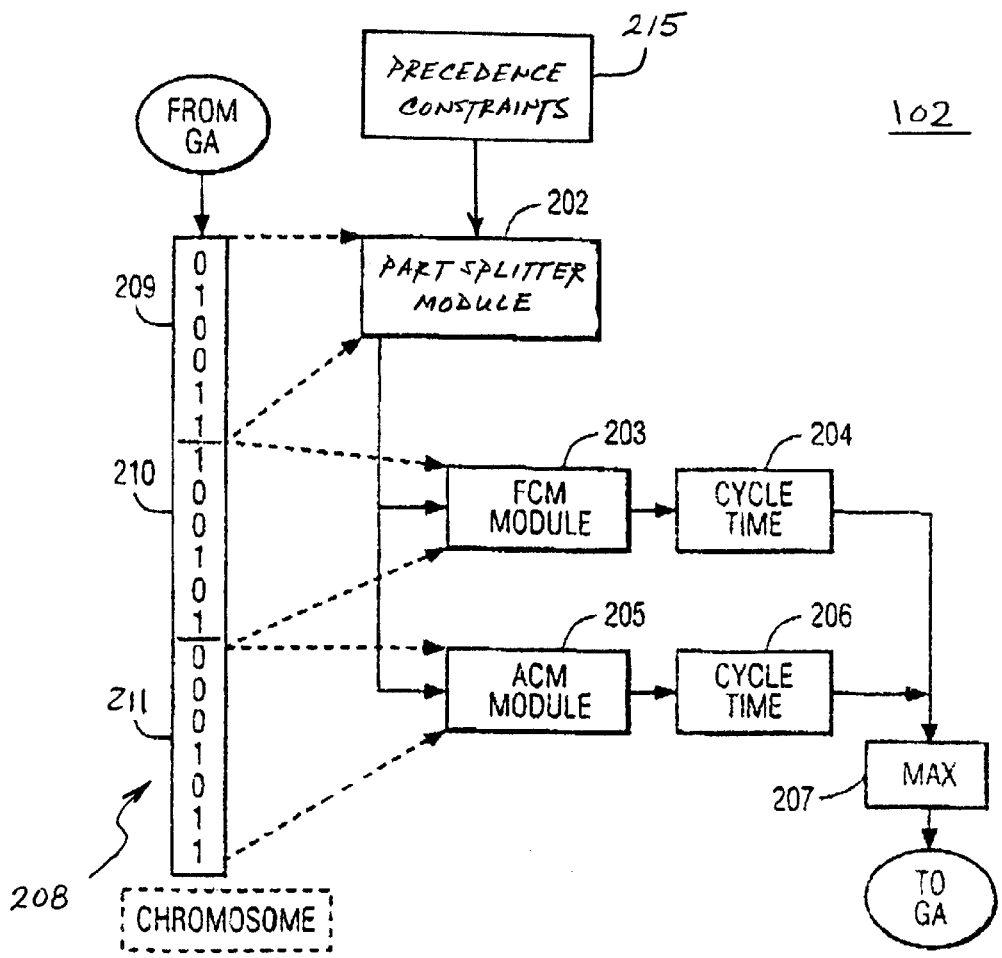
FIG. 5 shows a more detailed schematic diagram of a heuristic layout generator (HLG) portion of the modular optimizer of FIG. 4.

FIG. 5 illustrates in greater detail the HLG 102 its operation after initialization is complete. The HLG 102 as shown in the figure includes a part splitter module 202, an FCM module 203, and an ACM module 205. For this example, it is assumed that the machines 1, 3 of FIG. 1 are an FCM machine and an ACM machine, respectively. The FCM machine and the ACM machine have associated therewith the FCM module and the ACM module, respectively.

In accordance with the present invention, the part splitter module 202 has access to a set of precedence constraints 215. These constraints may be in the form of one or more precedence files stored in the memory device 111 of FIG. 4. The part splitter module accesses or is supplied with such files in conjunction with its operations in determining an appropriate configuration for a given production line, as will be described in greater detail below.

From GA 101, the HLG 102 receives a chromosome string 208. Only one string is shown in this figure, but in reality the HLG must act on each string generated by the GA. A first portion 209 of the chromosome string 208 represents parameters controlling how parts are to be split among the machines 1, 3. A second portion 210 of the chromosome string 208 represents parameters controlling layout of the first machine 1, which as previously noted is assumed to be an FCM machine such as that described above in conjunction with FIGS. 2 and 3. A third portion 211 of the chromosome string 208 represents parameters controlling layout of the second machine 3, which as previously noted is assumed to be an ACM machine. There may be one or more additional portions of the chromosome string 208, including genes used for each of the machines. The chromosome string here is shown schematically as having a fairly small number of bits. In fact, an actual chromosome string will generally be much longer, e.g., 100–4000 bits. Moreover, the order of the chromosome portions 209, 210 and 211 as shown in FIG. 5 is optional. The same function can be achieved with these segments in any order.

Although this example is given in terms of two particular machine types, i.e., FCM and ACM machines, the modular optimizer may equally well be adapted to lines with other numbers and types of machines by those of ordinary skill in the art.

Within the HLG 102, the splitter module 202 first works under control of the first portion 209 of the chromosome string 208 to produce a parts allocation between machine 1 and machine 3. Then the two modules 203, 205 generate layouts for machines 1, 3, respectively. Modules 203 and 205 operate in the manner described in the above-cited U.S. Pat. Nos. 5,390,283, 5,864,833 and 5,909,674. For example, these modules may operate as separate HLG modules, as described in U.S. Pat. No. 5,390,283, or may be line type modules directed to deal with a particular type of machine, as described in U.S. Pat. No. 5,864,833. Although this example includes only one FCM machine and one ACM machine, each module 203 and 205 can actually optimize a line of several machines, so long as those machines are of the same type.

Examples of tasks that may be performed by one or both of the modules 203 and 205 include the following:

1. Assigning grippers to PMs (or to tool (or nozzle) exchange units on the ACM);
2. Assigning feeder bars to pipette modules (or bar piers for the ACM);
3. Assigning feeder types to feeder bar slots (or trays and pallets to slots in tray stackers);
4. Assigning part types to pick positions;
5. Assigning individual parts to specific PM-index steps (FCM) or parts to charges (ACM);
6. Sequencing the placement of the individual parts on each PM during each index step (FCM); and
7. Sequencing BVM (Board Vision Module) imaging, if BVM is present.

After modules 203 and 205 generate layouts, modules 204 and 206 of the modular optimizer determine cycle time measures of fitness for those layouts. Modules 204 and 206 are also configured as described in the above-cited U.S. Pat. Nos. 5,390,283, 5,864,833 and 5,909,674. Then element 207 determines a maximum cycle time for the entire line from the component cycle times produced by modules 204 and 206. Although this example includes only two component placement machines, the modular optimizer can equally well be extended to more machines, and to different types of machines.

The modularity of the above-described modular optimizer is particularly well adapted to the addition of new machine types, since the entire chromosome does not have to be redesigned for each machine type added. Only new segments need to be added for new machine types.

In the HLG 102, none of the modules need to be modified with the addition of new machine types. Instead, new modules analogous to modules 203–206 can be added at the bottom of the figure for the additional machines.

Also, if one of the machines is modified, only the modules and chromosome portions relating to that machine need to be changed.

Element 207 outputs the measure of fitness to the GA 101, which iterates to the next step. The output can be in the form of a cost vector having three positions where:

Cost[0] is a fail code, which is the highest one encountered for any machine type in the line; the code will have one of two values as follows:
0=no failure
1=a layout failure in some machine type module;

Cost[1] is the cycle time for the slowest machine in the production line; if cost[0]=1, then cost[1] is the number of parts that could not be placed; and Cost[2] is the total number of pick positions used.

This 3-part cost vector is used hierarchically by the GA. That is, when comparing two chromosomes, the better chromosome is the one with the lower cost, where comparing starts at level 0 and proceeds to the next level only if there is a tie. An infeasible layout from any machine type module 203, 205 will have a cost[0] of one. If both chromosomes yield infeasible layouts, the one with the fewest parts not placed is better. If both chromosomes represent feasible solutions, the cycle times cost[1] are compared; and, if these are equal, the number of pick positions (roughly equivalent to the number feeders required) is used to break ties. If all three scores are equal, the chromosomes are considered equally fit. This scheme allows the GA 101 to make progress solving very difficult problems where feasible solutions are hard to discover, and to prefer solutions that require less hardware when cycle times are equal.

When iteration between the GA 101 and the HLG 102 appears to be converging on a reasonable solution, modules 203 and 205 can output the final layout to be used on the machines 1 and 3.

As previously noted, the illustrative embodiment of the invention incorporates a precedence constraint-handling feature into the above-described example modular optimizer. As will be described in detail below, the incorporation of this feature into the example modular optimizer may be implemented through modification of the part splitter module 202, the FCM module 203 and the ACM module 205.

III. Precedence Constraint Format

In the illustrative embodiment of the invention, a precedence constraint is specified as an input to a modular optimizer of the type described above using the following format:

A B MT which specifies that part A must be placed on a designated PCB before part B if either part is to be placed by machine type MT. Such a constraint may arise, e.g., from the close proximity of parts A and B on the PCB and the inherent accuracy limitations of the component placement machine. Note that a precedence constraint expressed in the manner shown above says nothing about the situation where neither part A nor part B is placed by machine type MT. If these parts are also constrained on other machine types, additional constraints must be specified. The illustrative embodiment is configured such that any number of precedence constraints may be specified. These constraints are read by the optimizer from a precedence constraint file referred to in conjunction with the illustrative embodiment as precedence.hlg. One or more of such files may be present in the set of precedence constraints 215 utilized by the part splitter module 202 of FIG. 5. An example precedence.hlg file is as follows:

number precedence constraints=22
"1" 1 "2" 1 F
"2" 1 "3" 1 F
"3" 1 "4" 1 F
"1" 1 "3" 1 F
"1" 1 "4" 1 F
"4" 1 "6" 1 F
"4" 1 "7" 1 F
"4" 1 "8" 1 F
"4" 1 "9" 1 F
"4" 1 "10" 1 F
"4" 1 "11" 1 F
"4" 1 "12" 1 F
"4" 1 "13" 1 F
"4" 1 "14" 1 F
"4" 1 "15" 1 F
"4" 1 "16" 1 F
"16" 1 "22" 1 F
"22" 1 "23" 1 F
"23" 1 "25" 1 F
"25" 1 "26" 1 F
"26" 1 "27" 1 F
"27" 1 "28" 1 F In the file format used in the above example, each part is designated by an item code (in quotes) and a circuit number. The machine type F in this example denotes an FCM machine. The machine type designations in a given precedence file are limited to the machine types known to the optimizer.

Although not a requirement of the invention, the optimizer may include an input routine that checks the precedence file for conflicts or other errors. Such an error may be evidenced by a cycle in the precedence file. Precedence constraints are transitive, i.e., if A<B and B<C then A<C, where "<" means "must precede," and therefore a set of precedence constraints can be viewed as a directed graph which must have no cycles in it. Numerous algorithms are known in the art for detecting cycles in graphs. A more particular example of such an algorithm is the type of algorithm known in the art as a topological algorithm.

A modular optimizer configured to satisfy precedence constraints generally must know the physical order of the machines in the production line. The example modular optimizer described above and in the above-cited U.S. patent application Ser. No. 09/286,026 generally defines a fixed order for describing the machine types in a production line. This fixed order is FCMs (if any) followed by ACMs (if any), and may be specified in a file referred to as a params.hlg file. The illustrative embodiment assumes that this order is the physical order. It is further assumed that machine types are not intermixed in the production line, i.e., all machines of one type will be together, followed by all machines of another type, etc. It should be noted, however, that these and any other assumptions made herein are for illustrative purposes only, and are not requirements of the invention.

IV. General Approach

The present invention in the illustrative embodiment provides a general approach to configuring a modular optimizer for the handling of precedence constraints such as those described above. The general approach is extendable to any number of different machine types, but will be illustrated herein using the above-noted FCM and ACM machine types.

In accordance with the general approach, precedence constraints are divided generally into two classes. The first class includes those precedence constraints that apply to one machine type only. These constraints are handled by the optimizer module associated with the particular machine type. For example, in the optimizer described in conjunction with FIGS. 4 and 5, the precedence constraints that apply to the FCM machine type are handled by the FCM module 203. The second class includes precedence constraints involving more than one machine type. These constraints are handled by a part splitter module of the modular optimizer. This part splitter module is also referred to herein as simply a "splitter." An example of such a module is the part splitter module 202 described in conjunction with FIG. 5.

It should be noted that even though the expression of each constraint specifies only one machine type, if the splitter assigns the two parts of a given constraint to different machine types, the splitter is responsible for ensuring that the assignment is feasible. In general, therefore, a determination as to whether a constraint is a "within machine type"

or a "between machine types" constraint depends on the action of the splitter, and thus cannot be made simply by reading the list of constraints.

An example of the division of responsibility for constraint handling among the elements of the modular optimizer will now be described. Using the constraint format given above, and specifying machine type MT=F (i.e., a constraint of the form A B F), the following three possibilities can be identified:

P1: The splitter assigns neither A nor B to an FCM machine type. In this case, the constraint can be ignored.

P2: The splitter assigns both A and B to FCM machine types. In this case, the constraint becomes the responsibility of the FCM module.

P3: The splitter assigns one part to the FCM machine type and the other to some other machine type. In this case, it is the responsibility of the splitter to ensure that the split satisfies the constraint. The machine modules can safely ignore it. Of course, the splitter must know the physical order of the machine types in the line.

V. Precedence Constraint Bookkeeping

A bookkeeping process is utilized in conjunction with the handling of precedence constraints in accordance with the techniques of the invention. This bookkeeping process uses a number of data structures, including a PART data structure and a BUCKET data structure, both of which will be described in detail below.

V.1 Part Data Structure

The bookkeeping process begins by reading in the above-noted precedence.hlg file and storing the corresponding constraints in one or more affected part data structures. The part data structure for a given part includes the following element:

PART_PRECEDENCE_ITEMS **prec; /* items only needed if part participates in precedence constraints */

This element is a pointer to an array with one element for each machine type. Example part data structure elements to hold precedence information for the given part are shown below:

```
typedef struct {
    int n_total_constraints;      /* static --
                                   get_precedence_constraints () */
    int n_pre_constraints;        /* static --
                                   get_precedence_constraints ()
                                   number of constraints where
                                   some other part must go
                                   before given part */
    int n_post_constraints;       /* static --
                                   get_precedence_constraints ()
                                   number of constraints where
                                   some other part must go after
                                   given part */
    int *pre_part_indexes;        /* static --
                                   get_precedence_constraints ()
                                   the parts that must go before
                                   the given part */
    int *post_part_indexes;       /* static --
                                   get_precedence_constraints ()
                                   the parts that must go after
                                   the given part */
    char recursion_flag;          /* dynamic --
                                   sum_precedence_constraints_
                                   within_mt () */
    int n_total_cum_constraints;  /* dynamic --
                                   sum_precedence_constraints_
                                   within_mt () */
    int n_pre_cum_constraints;    /* dynamic --
```

-continued

```
                                   sum_precedence_constraints_
                                   within_mt () number of
                                   constraints where some other
                                   part must go before given
                                   part */
    int n_post_cum_constraints;   /* dynamic --
                                   sum_precedence_constraints_
                                   within_mt () number of
                                   constraints where some other
                                   part must go after given
                                   part */
} PART_PRECEDENCE_ITEMS;
```

In the above data structures, there are a number of differences between the static constraint counts (n_total_constraints, n_pre_constraints, n_post_constraints) and the dynamic counts (n_total_cum_constraints, n_pre_cum_constraints, n_post_cum_constraints). One difference is that the static counts and their corresponding lists of part indexes (*pre_part_indexes and *post_part_indexes) are filled in when the precedence.hlg file is read in. These static counts include all constraints in which a given part participates, and are generally never altered. They are the repository of the constraint information from which the dynamic counts are computed. The dynamic counts are potentially updated every time the splitter makes its decisions because thereafter some constraints may not apply to a given machine type. Another difference is that the dynamic counts are accumulated, as indicated by the "_cum" labeling in the count names, such that the transitivity of precedence constraints is recursively accounted. This is done because the accumulated counts are used when determining bucket desirability for parts. For example, given two precedence constraints "A B F" and "B C F", the static and dynamic counts would be:

A: n_total=1 n_pre=0 n_post=1 n_total_cum=2 n_pre_cum=0 n_post_cum=2

B: n_total=2 n_pre=1 n_post=1 n_total_cum=2 n_pre_cum=1 n_post_cum=1

C: n_total=1 n_pre=1 n_post=0 n_total_cum=2 n_pre_cum=2 n_post_cum=0

Part A has only one static constraint, the one that specifies that part B must follow it, but part A has two accumulated constraints, because both B and C must ultimately follow it.

The dynamic counts may be computed using the above-noted routine sum_precedence_constraints_within_mt( ). This routine may be called from a routine one_time( ) in the case of an optimizer that handles only FCM machines. For optimizers handling multiple machine types, suitable logic may be added in a straightforward manner to determine when the dynamic count computation can be done in one time code and when it must be called anew for each chromosome. The sum_precedence_constraints_within_mt( ) routine sets and unsets the data element recursion_flag as it follows the chains of precedence constraints. This flag prevents multiple counting of the same part.

V.2 Bucket Data Structure

The present invention makes use of the concept of buckets as described in the above-cited U.S. Pat. No. 5,390,283. The HLG 102 may be configured to define a bucket for each PM at each index step. These buckets may be viewed as receptacles into which parts are placed and over which balance is to be maintained in configuring the production line. In the illustrative embodiment of the invention, an existing bucket data structure, e.g., an FCM_BUCKET_ITEMS data structure, is configured to include a temporal sequence element temp_seq that parallels an array of "stripes" or designated placement regions of a specified width on a PCB. This element is used to hold integers that indicate the temporal sequence in which the stripes on any given PCB will be visited by a PM. The logic for determining these integers is implemented in a routine fcm_setup_buckets( ) that is preferably configured to handle the following situations: (1) more than one PCB may be accessible to a PM in any index step; and (2) small index steps may leave some stripes accessible to a PM during more than one index step.

The above-noted routine fcm_setup_buckets( ) may assume that every PM will see a first stripe, denoted stripe 0, during at least one of the index steps. Note that this assumption may be violated if the GA is given control of the index stepping scheme. For example, in such an arrangement, the strict dependence on stripe 0 could be relaxed, and the process could be generalized to trigger on the lowest stripe number encountered. The routine may further assume that whenever multiple PCBs are accessible to a PM in an index step, only one instance of each stripe is considered accessible. For example, consider a PM with 3 accessible PCBs with 4 stripes each. This situation may be displayed as:

| PCB | 3 | 3 | 2 | 2 | 2 | 2 | 1 | 1 |
|---|---|---|---|---|---|---|---|---|
| STRIPE | 1 | 0 | 3 | 2 | 1 | 0 | 3 | 2 |
| Accessible | n | n | n | n | y | y | y | y |

This shows (reading right to left) PCB 1 stripes 2 and 3 followed by PCB 2 stripes 0–3 followed by PCB 3 stripes 0 and 1. Only the first four stripes from the right are considered accessible, so there is no ambiguity about which PCB will receive a part destined for a given stripe.

Application of the above-described routine fcm_setup_buckets( ) to an example PCB may be as follows (this may be viewed as part of a display that appears in a trace file, e.g., trace.hlg, when a suitable level of tracing is specified):

| PM [0] | stripes [temp_seq]: | 0 [0], 1 [0], 2 [1], 3 [1], 4 [2], 5 [2], |
|---|---|---|
| PM [1] | stripes [temp_seq]: | 3 [2], 4 [2], 5 [3], 0 [0], 1 [1], 2 [1], |
| PM [2] | stripes [temp_seq]: | 0 [0], 1 [0], 2 [1], 3 [1], 4 [2], 5 [2], |
| PM [3] | stripes [temp_seq]: | 3 [2], 4 [2], 5 [3], 0 [0], 1 [1], 2 [1], |

The PCBs in this example are configured with a pitch of 240 mm and six 40 mm stripes, and the index stepping process consists of 3 steps of 80 mm each. It can be seen that the even numbered PMs have a straightforward pattern seeing pairs of stripes starting with the leading edge of the PCB (stripe 0) in index step 0. The temporal sequences, shown in brackets, are also straightforward: 0,1,2. However, the odd numbered PMs see stripe 0 in index step 1 and see it along with the last stripe (5) of the preceding PCB. So the temporal sequencing starts with 0 at step 1, but only stripe 0 has this sequence number. Sequences 1 and 2 apply to the stripes accessible in steps 2 and 0 respectively, and a fourth sequence, e.g., sequence [3], is needed for stripe 5 now back in step 1. An assign_parts( ) routine of the FCM module 203 configured to support the temporal sequences described above is able to determine whether or not two parts assigned to a given PM will be placed in proper sequence.

VI. Configuring the FCM Module to Handle Precedence Constraints

In accordance with the invention, the FCM module 203 of the example modular optimizer described in conjunction with FIGS. 4 and 5 may be configured so as to facilitate handling of the above-described precedence constraints. By way of example, this may involve modification of an otherwise conventional assign_parts( ) routine of the FCM module 203 to include precedence constraint violation detection, a bucket desirability determination, and a new parts sorting technique. Each of these modifications is described in detail below.

VI.1 Constraint Violation Detection

As noted above, the assign_parts( ) routine of the FCM module 203 may be configured to include a check for violations of precedence constraints. Such a check may be included in the above-described choose_bucket_fcm( ) routine. More particularly, as each possible bucket is examined, if the part being placed participates in precedence constraints, then a check is made to determine if choosing this bucket would violate any constraints with the other parts already assigned. If so, then this bucket may be given a desirability=VERY_UNDESIRABLE, such that this bucket will never be selected. Of course, it is entirely possible that no eligible buckets will be found, in which case the part cannot be assigned and an infeasible setup results.

The check for constraint violations may assume that if other "pre" constraint parts are assigned to earlier PMs then no violation can occur. The check may include a similar assumption for "post" constraint parts and later PMs. There is technically a possibility for a part to be placed by PM[i+1] before a part is placed by PM[i], since all PMs do work simultaneously during a given index step. The question of interest in this context is whether two such parts can be involved in a precedence constraint such that the one placed by PM[i] is supposed to be placed after the one on PM[i+1]. This seems unlikely since it would require two parts that are separated by more than the inter-PM gap to be involved in a precedence constraint. Although it is possible that a chain of constrained part-pairs may span the inter-PM distance, such a circumstance would not permit the parts on the two ends of the chain to be considered for assignment to two adjacent PMs in the same index step. The above-noted check for constraint violations is therefore believed to be safe in practical applications. It should be noted that this check is only an illustrative example, and other checks may be used, including ones in which the above assumptions do not apply.

The check is also designed to handle a situation in which two constrained parts are assigned to the same PM. In this situation, it is permissible for both of the parts to be assigned to the same index step, because precedence can always be achieved by permuting the placement order. When the parts are assigned to different index steps, then the stripes involved must be consulted to detect violations. The temporal sequences are also consulted, in the manner described above.

VI.2 Bucket Desirability

Parts not involved in precedence constraints use a bucket desirability based on slack time. If a part participates in precedence constraints and the bucket being considered does not violate any of these constraints, then its bucket desirability may be computed as follows:

bucket desirability=n_fcm_PMs−abs(PM_i−PM_j)

where n_fcm_PMs denotes the number of PMs in an FCM line, PM_i is the PM of the bucket being considered and PM_j is the "ideal" PM for the part. PM_j is computed as PM_j=(n_fcn_PMs−1)*n_pre_cum_constraints(i)/
n_total_cum_constraints(i)

Figure 6:
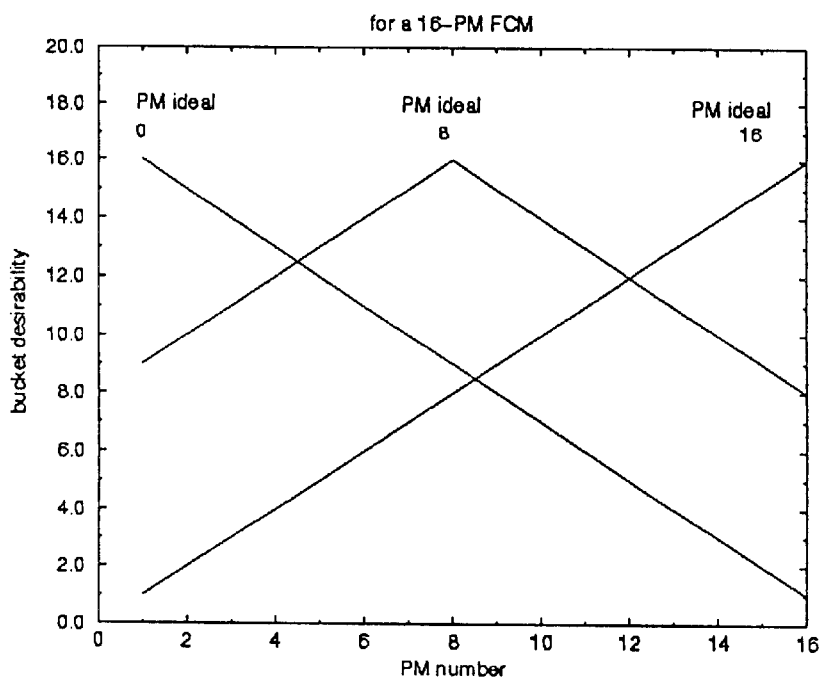
FIG. 6 is a plot of bucket desirability as a function of PM number in an illustrative embodiment of the invention.

FIG. 6 illustrates the manner in which the above-described bucket desirability function varies with PM number for an example 16-PM FCM machine, and for three different values of the ideal PM PM_j, i.e., PM_j=0, 8 and 16.

It should be noted that this bucket desirability function may be unduly rigid, particularly for cases with many constrained parts. However, its performance can be made substantially more flexible by creating a gene for each constrained part type. This gene codes for a shift in PM_j from its nominal position, i.e., the value of PM_j used is the nominal PM_j plus the gene value. The number of bits allocated to this gene is two plus the number of FCMs. Thus, there are 3 bits for a single FCM, 4 for two FCMs, etc. This allows for gene-controlled shifting up to half the number of PMs in the FCM line. If the part type has no post constraints, then its nominal PM_j will be at the end of the line, so the gene codes only for shifting to the left. Similarly, if there are no pre constraints, then the shift will be only to the right. If there are both pre and post constraints, then the shift range is roughly half left and half right. Care should be taken that the PM_j is never shifted out of the legal range of the FCM PMs.

VI.3 Parts Sorting

The illustrative embodiment of the invention uses the following sorting process for the parts. When there are precedence constraints, the parts are sorted first by n_total_cum_constraints, and then by whatever additional sorting process is dictated by the chromosome as in a conventional modular optimizer. This approach gives the most-constrained parts the first shot at the buckets at a time of maximum flexibility. In many applications, it will be desirable to minimize or otherwise limit the number of parts with precedence constraints, because avoiding constraint violations may induce poor balances. If there are many more unconstrained parts than constrained parts, then the unconstrained parts should improve the balance as they are added using conventional slack-based desirability.

VI.4 Parts Sequencing

The routine sequence_parts_in_bucket( ) does the final sequencing of the parts placed by a PM in each index step. As described in the above-cited U.S. Pat. No. 5,390,283, one possible implementation of such a routine places the part with the greatest pp_time first, the next greatest pp_time last, and between them the parts are sorted by slot/pick. The first and last parts are chosen this way so as to maximize the overlap between PM head movements and movements of the transport system. Between these two, the head just sweeps left-to-right or right-to-left depending on the parity of the index step, i.e., first one way, then the reverse on alternating steps.

In accordance with the invention, this conventional routine is modified from the above-described implementation to consider precedence constraints (if any) that may apply to the parts in the bucket. A local data structure, bucket_part_group, is configured to include elements to keep track of these local precedence constraints if and when they are found, and the routine is modified to include logic for locating and counting the constraints. The term "local" as used in this context refers to parts in the same bucket.

The logic that locates the part with the greatest pp_time was modified to ensure that this part has no other local parts that must be placed before it, i.e., no pre constraints. Note that even if all parts in the bucket are mutually constrained, there will always be one that has no within-bucket pre constraints. A similar change may be made to the logic that locates the part with the next greatest pp_time, but now ensuring no post constraints. Then, after all the parts have been sorted in the conventional manner, a new operation is applied that ensures that no precedence constraints are violated. This new operation first makes sure that the part considered for the first place position is one with no within-bucket pre constraints and the one placed in the last place position has no post constraints. The parts between the first and last place positions, after having been sorted in the conventional manner, are subjected to a final sweep with a bubble sort that corrects any constraint violations.

VII. Further Modifications to the FCM Module

Other changes that may be made to the FCM module 203 of the modular optimizer in the illustrative embodiment include changes to gripper desirability and an assign_grippers routine. Conventional versions of these elements are described in the above-cited U.S. Pat. No. 5,390,283.

In the case of gripper desirability, a new factor may be added that reflects the likelihood of honoring precedence constraints. This is similar to a factor to be described below for the splitter, but will be applied at the gripper level (i.e., specifying the number of parts that must be placed before a part that the gripper can handle). Like that used in the splitter, this factor will tend to favor PMs toward the front of the FCM line for grippers with many parts that have post constraints and PMs toward the rear of the FCM line for grippers with many parts that have pre constraints. Grippers with roughly equal pre and post constraints will prefer PMs towards the middle of the line. Grippers with few parts involved in any constraints have the greatest amount of freedom.

The assign_grippers routine should be configured so as to assign first those grippers with precedence constraints, leaving the unconstrained grippers for later assignment. Such an assign_grippers routine may thus have the following three phases: (1) first assigning to obtain feasibility for the grippers with the precedence constraints, (2) then assigning to obtain feasibility for grippers without precedence constraints; and (3) finally assigning to achieve specified balancing targets.

It should be noted that when the counts n_pre_contraints and n_post_contraints at the gripper level are about equal, it may be better to assign some of the grippers at the front of the line and others at the back rather than putting them all towards the middle as in the above-described approach. In general, a decision to proceed with modifications to the assign_grippers routine should be based on an observation that gripper assignments are creating problems in satisfying the precedence constraints.

The above-described changes to gripper desirability have been tested as follows. First, the constraints were tallied for each of the grippers considering only those parts that were constrained by other parts that could not be handled by the gripper in question. In other words, any constraints involving two parts both of which could be handled by the same gripper were not counted. Then a gene was created (2 bits) for each gripper that coded for a precedence factor weight (0, 2, 4 and 6 for the bit values 0, 1, 2 and 3, respectively). Let GD[i] be the gripper desirability for PM[i] computed as before (i.e., considering preassignments and the index stepping, but not precedence constraints) and GD_R be the range of these values among all FCM PMs (i.e., max–min). Let PD[i] be the precedence desirability for PM[i] for a gripper computed exactly like the part bucket desirability above except using the gripper's pre and total constraints. Let G be the precedence factor weight provided by the gene for this gripper. Then the gripper desirability actually used (used_GD[i]) for PM[i] is computed as:

used_GD[i]=GD[i]+GD_R * PD[i] * G.

Figure 7:
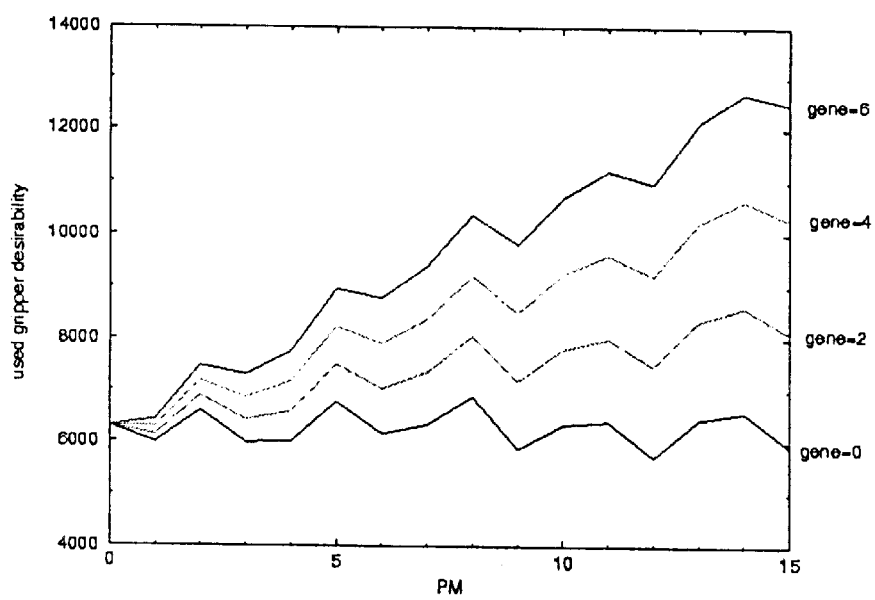
FIG. 7 illustrates gripper desirability as a function of PM number for different genes in an illustrative embodiment of the invention.

FIG. 7 shows a set of plots of used gripper desirability used_GD[i] for a 16-PM FCM machine and a gripper with only pre constraints, using each of the above-noted gene values 0, 2, 4 and 6. PD[i] increases from zero for PM[0] to 15/16 for PM[15] in this example.

VIII. Modifications to the Part Splitter Module

In the illustrative embodiment, the part splitter module 202 includes the processing functions described in conjunction with the general approach above. At least two additional modifications may be made to the part splitter module in order to facilitate the handling of precedence constraints in accordance with the invention. Each of these modifications will be described in detail below.

The first of the above-noted modifications is a modification of part_type-splitting logic such that it will tend to favor splits that honor the precedence constraints. This change may involve the addition of another factor to part_type group (ptype_group) sorts for each machine type, with the new factor sorting part types by the number of parts that must be placed before some part in that ptype_group (i.e., the number of precedence constraints). This factor should be treated in an opposite fashion for machine types at the beginning and the end of the production line.

A more detailed example of the first modification will now be provided. This example approach is similar to that previously described in conjunction with the FCM module 203, except that instead of relying on the count of the number of pre and post constraints, it relies on the maximum length of chains of such constraints.

In accordance with this example approach, the part splitter module may be configured to handle pre and post precedent constraints by biasing the assignment of the machine type to each ptype_group, and ordering the part types within the ptype_group (or the ordering of the parts within the special ptype_group that consists of a single part type whose parts are split among machine types).

Each ptype_group is typically assigned a default machine type. The default machine type is generally chromosome determined, i.e., the first machine type listed in an order of machine types (mtype_order). However, this can be overridden, either if there are a large number of part types and a chromosome-determined fast_default_heuristic is on (in which case the default is set to the fastest machine type), or if more than half the part types are pre-assigned to some machine type (in which case this machine type is chosen). In order to handle pre and post precedent constraints, an additional condition may be added for overriding the chromosome determined default machine type.

Although most part types in a given ptype_group end up on the corresponding default machine type, some of the part types can be selected for placement on other machine types. These part types may be chosen from the ptype_group's list of part types, with a bias toward choosing those at the top of the list. A sort list (of part types) may be maintained for each machine type of a ptype_group. The part types are sorted according to the number of parts per part type, and according to whether they are pre-assigned to the machine type in question. In order to allow pre and post precedent constraints to bias the assignment of part types, additional sort order conditions may be added.

As noted above, the FCM module makes use of the counts for each part of its pre and post precedent constraints. It counts these constraints via a recursive routine that chains its way through the constraints. More relevant for the part splitter module is the length of the chains, as opposed to the number of constraints found. Therefore, the part splitter module may determine for each part (and part type) its longest pre constraint chain and its longest post constraint chain. As will become apparent, the chains for the part types are the ones that are most relevant (except for a special split ptype_group), but the description will begin with chains for parts since these are simpler.

An example will be used to illustrate how chains are determined, using the following labeling convention. Part types will be identified with capital letters, e.g., A, B, C, etc. Parts will be identified with a capital letter indicating the part type to which a part belongs, followed by a number, e.g., A1, A2, B1, B2, etc.

One complication needs to be addressed at this point. The specification of the constraints is done by machine type. Thus if parts A5 and B3 are constrained on the FCM there will be a constraint such as the following: A5 B3 F. But if these parts can also be placed by the ACM, then there will also be a similar constraint for the ACM: A5 B3 A. As long as there are no conflicts, e.g., a reversal of the ordering for different machine types, then the union of the constraints should generally be used. In other words, the machine type is ignored when calculating chains, and duplicate records (for different machine types) are treated as a single record. Conflicts can be detected and addressed in the manner described above, e.g., using an input routine that checks the precedence file for conflicts.

Returning to the example illustrating chaining of parts, if part C1 must be placed after part B3 which must be placed after part A5, then part A5 has a post chain of at least length two: A5->B3->C1. If part C2 must be placed after B3 and D4 after C2, then A5 has a post chain of at least length three: A5->B3->C2->D4. If these were the only constraints, then the following pre and post chain lengths (in parentheses) could be assigned to each part:

A5 (0, 3) −3
B3 (1, 2) −1
C1 (2, 0) 2
C2 (2, 1) 1
D4 (3, 0) 3

The last column is the net chain length, i.e., the difference between the pre chain length and the post chain length.

Part type chains are determined in a similar manner, and often will be equal to the length of the chains of the part type's part with the maximum chain length. For example, in the above example, part type C has two parts with chains, with C2 having the longest chain. So the maximum pre and post chains for part type C are 2 and 1. However, suppose that part type D has a part D1 which is a pre constraint for part E1. Although this is not a member of part C2's chain, it will be a member of part type C's chain. Since each part type (except for the above-noted special split part type) is assigned to a single machine type, the chaining for part types generally needs to be calculated over all parts of the part types. Another example will help to clarify this point. Suppose part G1 must be placed before H1, and H2 before I2, and I2 before J3. Then the pre and post chains for the parts are:

G1 (0, 1) −1
H1 (1, 0) 1
H2 (0, 2) −2
I2 (1, 1) 0
J3 (2, 0) 2

Whereas the pre and post chains for the part types are:

G (0, 3) −3
H (1, 2) −1
I (2, 1) 1
J (3, 0) 3

Alternatively, instead of using chain lengths, one could use the number of pre and post connections, in a manner similar to that used for the FCM. However, what counts as a connection in the case of a part type would be done in a manner similar to that above for chain length, e.g., as long as some parts of two part types are connected, then the part types are considered connected. The particular approach most appropriate for use in a given application will generally depend on a variety of application-specific factors, as will be apparent to those skilled in the art.

It should be noted that total net chain lengths will generally need to be calculated for each ptype_group. This can be done by summing over all the net part type chains of the part types in the ptype_group (or in the case of the special split ptype_group, summing over all the net part chains). However, an allowance may also be made for distinguishing those cases where the positives cancel the negatives, resulting in a zero sum, and those cases where there are no constraints, also resulting in a zero sum. In the former case, the ptype_group with a zero sum should default toward the middle of the line, whereas in the latter case, the ptype_group can go anywhere (at least based on this criterion).

The above-described chain information is used in the following manner. A ptype_group's total net chain length is used for determining whether the chromosome-determined default machine type should be overridden. If the value is a large negative number, then the default machine type should be one at the beginning of the line. If the value is a large positive number, then the default machine type should be one at the end of the line. A single fixed threshold represented by a large negative and large positive numbers with equivalent magnitude may be determined empirically in a straightforward manner. Alternatively, instead of a fixed single threshold, multiple thresholds can be determined based on the chromosome. For example, there may be a two-bit gene which determines three different threshold values, each used for both positive and negative values, and a fourth value for not using the threshold.

The multiple criteria for determining when to override the chromosome-determined default machine type, i.e., number of part types, pre-assignments and precedent constraints, should be ordered in terms of importance. In general, the pre-assignments criterion dominates the number of part types criterion, and the precedence constraint criterion should dominate the pre-assignments criterion. Alternatively, since these latter two criteria can vary in terms of size (e.g., number of pre-assignments or size of net chains), a default ordering based on the relative sizes of the criteria may be used. For example, if more than two thirds of the part types are preassigned to a particular machine type, then this takes precedence over a net chain size indicating a different machine type if the absolute value of the chain size is less than a specified threshold, e.g., 5. Alternatively, a bit in the chromosome could be used to determine which criterion should take precedence when there is a conflict.

The manner in which the chaining information can be used to order the part types in the ptype_groups will now be described. Again, the relevant information is the net chain length, but in this case for the part type. In general, those part types which have a large negative value should be at the front of the list for machine types that are early in the line, and the opposite should be true for machine types that are late in the line.

It should be noted that in the case of the above-noted special split ptype_group, the ordering will be on the net chain length for the parts.

Again, it is important to integrate conflicting criteria when ordering part types. In addition to net chain length there are the criteria of number of parts and pre-assignments. Since precedence constraints is generally a more important criterion than number of parts, it should be the first sort criterion. However, it may be useful to group the net chain lengths into bands, then sort on the number of parts within these bands, and then finally sort on the pre-assignment criterion. For example, there may be three bands, net chains under −2, from −2 to 2, and over 2.

An alternative is to separate the sort lists from the machine types and instead keep several sort lists, and let the chromosome determine which list to use. A potential problem with this alternative is that the part type assignment order will no longer correspond to a fixed sort list, but its meaning will vary depending on which sort list is selected by the chromosome. This could make it difficult for the GA to figure out which list to use, e.g., it may cause instability. However, this problem can be alleviated by keeping a list of the sorted indexes instead of actually sorting the part types in the sort list. This same list could be used for indexing part type index (ptype_index) and part type assignment (ptype_assign) values of the ptype_group.

An example will help to clarify this point. Suppose the part type indexes that make up the ptype_group[0] are 7, 11, 13, 20, 22, and that these indexes are stored in ptype_group[0].ptype_index[mt][]. Instead of having a separate list of indexes for each machine type, with different sort orders, there would be one list of indexes. Then there would be different lists of sort orders. Suppose the part types are already in ascending order of number of parts. Then the sort order indexes for ascending parts would be 0, 1, 2, 3, 4, and the sort order indexes for descending parts would be 4, 3, 2, 1, 0. There could be other sort order indexes for other ways of sorting. These sort order indexes would be used for indexing both ptype_group ptype_index and ptype_group ptype_assign bits. Thus the ptype_assign bits would have the same meanings for all sort orders. There will generally be no point in keeping reverse sort orders; one only needs to do what is currently done and start at the opposite end of the list.

An additional criterion may be added for choosing the part type that is made the special split ptype_group. This additional criterion may be, e.g., a large number of parts with precedent constraints, split fairly evenly between pre and post. Again, a determination should be made as to which criterion is most important, the number of parts or the number of parts with precedent constraints. The previously-described banding approach may be used to facilitate this determination. In this case, first band the number of parts, and then choose within the highest band, based on chaining. There is a remaining trade off between the number of parts with chains and whether these chains are evenly balanced between pre and post precedent constraints (e.g., net negative or positive). However, this trade off is difficult to make a priori. It is therefore preferable to adopt a simple method for implementing the trade off, and then adjust the method as the need arises, either by adding more complex rules, or by adding chromosome control.

The second of the above-noted modifications to the part splitter module 202 is an extension to include a code indicating when the splitter fails to honor the precedence constraints. This change may be implemented by providing a new code in an otherwise conventional fail code process, along with logic that checks for constraint violations and returns the new code if the split is known to be infeasible. A value should be returned in the cycle time field that can be used to break ties among pairs of chromosomes when both are infeasible. Such a value may be based at least in part on a measure of the number of violated precedence constraints.

As an alternative to the above-described fail code approach, parts which involve precedence constraint violations (between machine types) may be determined by a special routine and those parts removed from the list of parts sent to the HLG modules 203 and 205. However, the fail code would include these parts as parts not placed. Thus the same penalty mechanism used for evaluating fitness of failed solutions (parts not placed) may be adapted to take into account failed precedence constraints.

IX. Modifications to the ACM Module

A number of modifications may be made to the ACM module 205 of the example modular optimizer described in conjunction with FIGS. 4 and 5 in order to facilitate the handling of precedence constraints in accordance with the invention. In the illustrative embodiment, this may involve modification of an otherwise conventional charge-map insertion algorithm to check for constraint violations when inserting parts. It should almost always be possible to avoid violations since it is always possible to create a new charge with the new part alone. This may incur a large cost for nozzle swaps and perhaps many one-part charges, but if constrained parts are placed first (as described previously for the FCM), then later parts may compensate for the one-part charges. The only time this would not be possible would be if two parts are already grouped in a two-part charge and the new part must be placed before one and after the other. Such a situation may be addressed by breaking up the two-part charge and placing the new part with one of them, or by creating a string of 3 one-part charges. This process should always be able to produce feasible, if costly charge-maps. It may be desirable to create a routine capable of ameliorating some of the worst cost impacts.

Advantageously, a modular optimizer configured to handle precedence constraints in accordance with the techniques of the invention provides performance which in many applications results in only a minimal penalty relative to a corresponding unconstrained implementation. While the extra genes needed by the constrained implementation can make the search spaces much larger, it is generally not substantially more difficult to obtain a solution for the constrained implementation than for the unconstrained implementation. In some cases, it may be possible that a better solution is found for the constrained implementation than for the unconstrained implementation.

The invention can be implemented at least in part in the form of one or more software programs stored in an electronic, magnetic or optical memory or other type of machine-readable medium. For example, the various modules of the modular optimizer as described above can be implemented in the form of software stored in the memory 111 and executed by the processor 110.

The above-described embodiments of the invention are intended to be illustrative only. For example, the invention can be used in other types of modular optimizers, and can be applied to production lines with a wide variety of different arrangements and types of component placement machines. These and numerous other embodiments within the scope of the following claims will be apparent to those skilled in the art.

What is claimed is:

1. An apparatus for determining a configuration of a production line comprising one or more component placement machines used to place components for assembly, the apparatus comprising:

a memory for storing information characterizing at least a portion of the production line; and a processor coupled to the memory and operative to implement at least a portion of a modular optimizer having a part splitter module and a plurality of different machine modules each associated with a different component placement machine type, wherein the plurality of machine modules further comprises at least a Fast Component Mounter (FCM) module and an Advanced Component Mounter (ACM) module, the modular optimizer: determining a set of precedence constraints including at least a first class of constraints that apply to only one of the component placement machine types and a second class of constraints that apply to more than one of the component placement machine types; processing each of the constraints in the first class of constraints that are associated with a given machine type in a corresponding one of the machine modules; and processing the second class of constraints in the part splitter module, the part splitter module providing inputs to one or more of the machine modules; wherein outputs of the machine modules provide information used to determine the configuration.

2. The apparatus of claim 1 wherein separation of the set of precedence constraints into the first and second classes of precedence constraints is implemented at least in part in the part splitter module of the modular optimizer.

3. The apparatus of claim 2 wherein for a given precedence constraint of the form A B MT, which specifies that part A must be placed on a designated board before part B if either part is to be placed by a machine type MT, the part splitter module: (i) assigns neither part A nor part B to a machine of type MT, in which case the constraint can be ignored; (ii) assigns both part A and part B to machines of type MT, such that the constraint is in the first class of constraints and is handled by the machine module corresponding to machine type MT; or (iii) assigns one of part A and part B to one machine type and the other to another machine type, such that the constraint is in the second class of constraints and is handled by the part splitter module.

4. A modular optimizer for determining a configuration of a production line comprising one or more component placement machines used to place components for assembly, the modular optimizer comprising:

a part splitter module; and a plurality of different machine modules each associated with a different component placement machine type, wherein the plurality of machine modules further comprises at least a Fast Component Mounter (FCM) module and an Advanced Component Mounter (ACM) module;

wherein the modular optimizer is operative: to determine a set of precedence constraints including at least a first class of constraints that apply to only one of the component placement machine types and a second class of constraints that apply to more than one of the component placement machine types; to process each of the constraints in the first class of constraints that are associated with a given machine type in a corresponding one of the machine modules; and to process the second class of constraints in the part splitter module, the part splitter module providing inputs to one or more of the machine modules; wherein outputs of the machine modules provide information used to determine the configuration.

5. The modular optimizer of claim 4 wherein separation of the set of precedence constraints into the first and second classes of precedence constraints is implemented at least in part in the part splitter module of the modular optimizer.

6. The modular optimizer of claim 5 wherein for a given precedence constraint of the form A B MT, which specifies that part A must be placed on a designated board before part B if either part is to be placed by a machine type MT, the part splitter module: (i) assigns neither part A nor part B to a machine of type MT, in which case the constraint can be ignored; (ii) assigns both part A and part B to machines of type MT, such that the constraint is in the first class of constraints and is handled by the machine module corresponding to machine type MT; or (iii) assigns one of part A and part B to one machine type and the other to another machine type, such that the constraint is in the second class of constraints and is handled by the part splitter module.

7. An article of manufacture comprising a machine-readable medium for storing one or more software programs for use in determining a configuration of a production line comprising one or more component placement machines used to place components for assembly, the one or more programs when executed implementing the steps of:

determining a set of precedence constraints including at least a first class of constraints that apply to only one component placement machine type and a second class of constraints that apply to more than one component placement machine type;

processing each of the constraints in the first class of constraints that are associated with a given machine type in a corresponding machine module of a modular optimizer which includes a plurality of machine modules each corresponding to one of the machine types, wherein the plurality of machine modules further comprises at least a Fast Component Mounter (FCM) module and an Advanced Component Mounter ACM module; and processing the second class of constraints in a part splitter module of the modular optimizer, the part splitter module providing inputs to one or more of the machine modules;

wherein outputs of the machine modules provide information used to determine the configuration.

8. The article of manufacture of claim 7 wherein separation of the set of precedence constraints into the first and second classes of precedence constraints is implemented at least in part in the part splitter module of the modular optimizer.

9. The article of manufacture of claim 8 wherein for a given precedence constraint of the form A B MT, which specifies that part A must be placed on a designated board before part B if either part is to be placed by a machine type MT, the part splitter module: (i) assigns neither part A nor part B to a machine of type MT, in which case the constraint can be ignored; (ii) assigns both part A and part B to machines of type MT, such that the constraint is in the first class of constraints and is handled by the machine module corresponding to machine type MT; or (iii) assigns one of part A and part B to one machine type and the other to another machine type, such that the constraint is in the second class of constraints and is handled by the part splitter module.

10. A method for use in determining a configuration of a production line comprising one or more component placement machines used to place components for assembly, the method comprising:

determining a set of precedence constraints including at least a first class of constraints that apply to only one component placement machine type and a second class of constraints that apply to more than one component placement machine type;

processing each of the constraints in the first class of constraints that are associated with a given machine type in a corresponding machine module of a modular optimizer which includes a plurality of machine modules each corresponding to one of the machine types, wherein the plurality of machine modules comprises at least one Fast Component Mounter (FCM) module and at least one Advanced Component Mounter (ACM) module; and processing the second class of constraints in a part splitter module of the modular optimizer, the part splitter module providing inputs to one or more of the machine modules;

wherein outputs of the machine modules provide information used to determine the configuration.

11. The method of claim 10 wherein at least a subset of the set of precedence constraints comprises precedence constraints of the form A B MT, which specifies that part A must be placed on a designated board before part B if either part is to be placed by a machine type MT.

12. The method of claim 10 wherein separation of the set of precedence constraints into the first and second classes of precedence constraints is implemented at least in part in the part splitter module of the modular optimizer.

13. The method of claim 12 wherein for a given precedence constraint of the form A B MT, which specifies that part A must be placed on a designated board before part B if either part is to be placed by a machine type MT, the part splitter module: (i) assigns neither part A nor part B to a machine of type MT, in which case the constraint can be ignored; (ii) assigns both part A and part B to machines of type MT, such that the constraint is in the first class of constraints and is handled by the machine module corresponding to machine type MT; or (iii) assigns one of part A and part B to one machine type and the other to another machine type, such that the constraint is in the second class of constraints and is handled by the part splitter module.

14. The method of claim 10 wherein if two parts associated with a given precedence constraint are assigned to two different machine types, the part splitter module determines if the assignment is feasible.

15. The method of claim 10 wherein the determining step utilizes a data structure which includes static constraint counts and dynamic constraint counts, the static constraint counts being determined upon reading of a precedence constraint file, the dynamic constraint counts being determined on a cumulative basis in accordance with decisions of the splitter module regarding assignment of particular parts to particular machine types.

16. The method of claim 10 wherein a given one of the machine modules is configured such that parts are always first sorted based on a total cumulative number of the precedence constraints.

17. A method for use in determining a configuration of a production line comprising one or more component placement machines used to place components for assembly, the method comprising the steps of:

determining a set of precedence constraints including at least a first class of constraints that apply to only one component placement machine type and a second class of constraints that apply to more than one component placement machine type;

processing each of the constraints in the first class of constraints that are associated with a given machine type in a corresponding machine module of a modular optimizer which includes a plurality of machine modules each corresponding to one of the machine types; and processing the second class of constraints in a part splitter module of the modular optimizer, the part splitter module providing inputs to one or more of the machine modules;

wherein a given one of the machine modules of the modular optimizer is configured such that if selection of one of a plurality of buckets for use with a part subject to a precedence constraint will violate any constraints associated with previously-assigned parts, a low level of desirability is assigned to the bucket, and wherein outputs of the machine modules provide information used to determine the configuration.

18. The method of claim 17 wherein at least a subset of the set of precedence constraints comprises precedence constraints of the form A B MT, which specifies that part A must be placed on a designated board before part B if either part is to be placed by a machine type MT.

19. The method of claim 17 wherein separation of the set of precedence constraints into the first and second classes of precedence constraints is implemented at least in part in the part splitter module of the modular optimizer.

20. The method of claim 19 wherein for a given precedence constraint of the form A B MT, which specifies that part A must be placed on a designated board before part B if either part is to be placed by a machine type MT, the part splitter module: (i) assigns neither part A nor part B to a machine of type MT, in which case the constraint can be ignored; (ii) assigns both part A and part B to machines of type MT, such that the constraint is in the first class of constraints and is handled by the machine module corresponding to machine type MT; or (iii) assigns one of part A and part B to one machine type and the other to another machine type, such that the constraint is in the second class of constraints and is handled by the part splitter module.

21. The method of claim 17 wherein if two parts associated with a given precedence constraint are assigned to two different machine types, the part splitter module determines if the assignment is feasible.

22. The method of claim 17 wherein the plurality of machine modules comprises at least an FCM module and an ACM module.

23. The method of claim 17 wherein the determining step utilizes a data structure which includes static constraint counts and dynamic constraint counts, the static constraint counts being determined upon reading of a precedence constraint file, the dynamic constraint counts being determined on a cumulative basis in accordance with decisions of the splitter module regarding assignment of particular parts to particular machine types.

24. The method of claim 17 wherein a given one of the machine modules is configured such that a bucket desirability is computed for a part subject to a precedence constraint as a function of a ratio of a total cumulative number of "pre" precedence constraints to a total cumulative number of precedence constraints.

25. The method of claim 17 wherein a given one of the machine modules is configured such that parts are always first sorted based on a total cumulative number of the precedence constraints.

26. A method for use in determining a configuration of a production line comprising one or more component placement machines used to place components for assembly, the method comprising the steps of:

determining a set of precedence constraints including at least a first class of constraints that apply to only one component placement machine type and a second class of constraints that apply to more than one component placement machine type;

processing each of the constraints in the first class of constraints that are associated with a given machine type in a corresponding machine module of a modular optimizer which includes a plurality of machine modules each corresponding to one of the machine types; and processing the second class of constraints in a part splitter module of the modular optimizer, the part splitter module providing inputs to one or more of the machine modules;

wherein a given one of the machine modules is configured such that a bucket desirability is computed for a part subject to a precedence constraint as a function of a ratio of a total cumulative number of "pre" precedence constraints to a total cumulative number of precedence constraints, and wherein outputs of the machine modules provide information used to determine the configuration.

27. The method of claim 26 wherein at least a subset of the set of precedence constraints comprises precedence constraints of the form A B MT, which specifies that part A must be placed on a designated board before part B if either part is to be placed by a machine type MT.

28. The method of claim 26 wherein separation of the set of precedence constraints into the first and second classes of precedence constraints is implemented at least in part in the part splitter module of the modular optimizer.

29. The method of claim 28 wherein for a given precedence constraint of the form A B MT, which specifies that part A must be placed on a designated board before part B if either part is to be placed by a machine type MT, the part splitter module: (i) assigns neither part A nor part B to a machine of type MT, in which case the constraint can be ignored; (ii) assigns both part A and part B to machines of type MT, such that the constraint is in the first class of constraints and is handled by the machine module corresponding to machine type MT; or (iii) assigns one of part A and part B to one machine type and the other to another machine type, such that the constraint is in the second class of constraints and is handled by the part splitter module.

30. The method of claim 26 wherein if two parts associated with a given precedence constraint are assigned to two different machine types, the part splitter module determines if the assignment is feasible.

31. The method of claim 26 wherein the plurality of machine modules comprises at least an FCM module and an ACM module.

32. The method of claim 26 wherein the determining step utilizes a data structure which includes static constraint counts and dynamic constraint counts, the static constraint counts being determined upon reading of a precedence constraint file, the dynamic constraint counts being determined on a cumulative basis in accordance with decisions of the splitter module regarding assignment of particular parts to particular machine types.

33. The method of claim 26 wherein a given one of the machine modules of the modular optimizer is configured such that if selection of one of a plurality of buckets for use with a part subject to a precedence constraint will violate any constraints associated with previously-assigned parts, a low level of desirability is assigned to the bucket.

34. The method of claim 26 wherein a given one of the machine modules is configured such that parts are always first sorted based on a total cumulative number of the precedence constraints.

* * * * *